(12) United States Patent
Rahman et al.

(10) Patent No.: US 6,470,365 B1
(45) Date of Patent: Oct. 22, 2002

(54) METHOD AND ARCHITECTURE FOR COMPLEX DATAPATH DECIMATION AND CHANNEL FILTERING

(75) Inventors: Mahibur Rahman, Lake Worth; Christopher T. Thomas, Fort Lauderdale, both of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/378,932

(22) Filed: Aug. 23, 1999

(51) Int. Cl.$^7$ .............................................. G06F 17/10
(52) U.S. Cl. ...................................................... 708/313
(58) Field of Search ........................................ 708/313

(56) References Cited

U.S. PATENT DOCUMENTS

| | | | | |
|---|---|---|---|---|
| 5,410,498 A | * | 4/1995 | Staver | 708/313 |
| 5,621,345 A | * | 4/1997 | Lee et al. | 708/313 |
| 5,689,449 A | * | 11/1997 | Saramaki et al. | 708/313 |
| 5,717,617 A | * | 2/1998 | Chester | 708/313 |
| 5,751,615 A | * | 5/1998 | Brown | 708/313 |
| 5,777,908 A | * | 7/1998 | Inogai | 708/313 |
| 5,880,973 A | * | 3/1999 | Gray et al. | 708/313 |
| 6,260,053 B1 | * | 7/2001 | Maulik et al. | 708/313 |
| 6,279,019 B1 | * | 8/2001 | Oh et al. | 708/313 |

\* cited by examiner

*Primary Examiner*—David H. Malzahn
(74) *Attorney, Agent, or Firm*—Randi L. Dulaney

(57) ABSTRACT

A decimation and channel filter (100 or 23) in an oversampled system includes a combined decimation and channel filtering architecture for simultaneously processing in-phase and quadrature phase complex input signals. A decimation filter (24) of the combined decimation and channel filter provides sampled outputs to a memory (108) to provide an intermediate result (604), which is stored in the memory (108) in a first format (608). A channel filter (26) of the combined decimation and channel filter processes (610) a decimation final result of the decimation filter in a second format in the memory to provide a final result. This architecture minimizes cost and current drain in a complex signal path decimation and channel filtering process. In addition, a channel filtering algorithm is used to ideally minimize current drain by a factor of 2.

14 Claims, 6 Drawing Sheets

METHOD AND ARCHITECTURE FOR COMPLEX DATAPATH DECIMATION AND CHANNEL FILTERING

FIELD OF THE INVENTION

The present invention is directed to an efficient method and architecture that performs both decimation and channel filtering for complex signals, and more particularly to a communication device capable of decimation and channel filtering using the same architecture for both functions.

BACKGROUND OF THE INVENTION

To achieve optimal static, simulcast, and fading performance in a wireless receiver, a multi-bit digital detector such as a correlator based demodulator is typically required. A sufficient number of bits of dynamic range must be provided at the input of such a type of detector to achieve this. Thus, an analog-to-digital (A/D) conversion needs to be performed at a particular point in the receiver signal path to provide the desired number of bits of resolution at the detector. In the latest technology, one of the most cost and power efficient ways to provide a large dynamic range is to use a 1-bit oversampled sigma delta AID converter. However, to convert from the high oversampled rate of the sigma delta converter to the much lower baseband sampling rate while trying to preserve the in-band signal-to-noise ratio, a decimation filter is required. In addition, following the decimation filter, a channel filter is typically needed in a wireless receiver to sufficiently attenuate interfering adjacent channel signals before digital detection can be performed. Currently, there are no low cost power efficient architectures to provide both decimation and channel filtering. Thus, what is needed is a very low cost and power efficient hardware architecture to perform both decimation as well as channel filtering using the same basic architecture.

DESCRIPTION OF A PREFERRED EMBODIMENT

Figure 1:
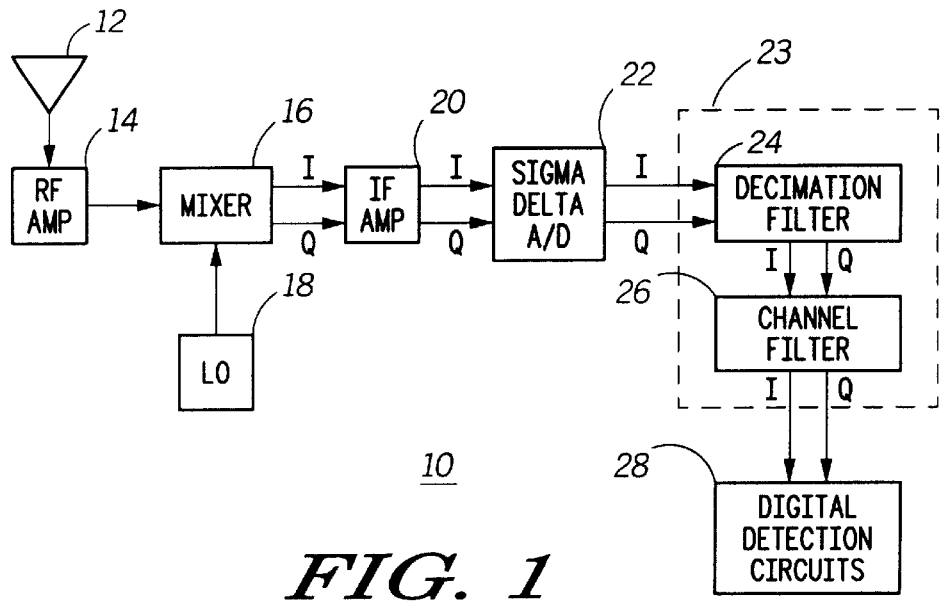
FIG. 1 is a block diagram of a selective call receiver having an architecture for complex datapath decimation and channel filtering in accordance with the present invention.

FIG. 1 illustrates a selective call receiver 10 arranged and constructed in accordance with the present invention. To achieve optimal static, simulcast, and fading performance in a wireless receiver, a multi-bit digital detector such as a correlator based demodulator is typically required. A sufficient number of bits of dynamic range must be provided at the input of such a detector to achieve such optimum performance. Thus, an analog-to-digital (A/D) conversion needs to be performed at a particular point in the receiver signal path to provide the desired number of bits of resolution at the detector. In the latest technology, one of the most cost and power efficient ways to provide a large dynamic range is to use a 1-bit oversampled sigma delta A/D converter. However, converting from the highly oversampled rate of the sigma delta converter to the much lower baseband sampling rate while trying to preserve the in-band signal-to-noise ratio, a decimation filter is required. In addition, following the decimation filter, a channel filter is typically needed in a wireless receiver to sufficiently attenuate interfering adjacent channel signals before digital detection can be performed. The present invention provides a very low cost and power efficient hardware architecture to perform both decimation as well as channel filtering using the same basic architecture. The architecture allows for the practical implementation of the indicated functions in a low cost and power efficient dedicated hardware solution.

Referring once again to FIG. 1, the selective call receiver 10 preferably comprises an antenna 12 for receiving radio frequency (RF) signals coupled to a RF frontend section 14. Typically the RF frontend section 14 would be comprised of an RF amplifier (not shown) which selects the desired frequency and amplifies it, a mixer 16 mixes a local oscillator signal (18) with the signal from section 14 and converts the desired spectrum to baseband (in zero IF receivers), and an IF amplifier 20 amplifies the baseband signal. After this, the baseband analog signal must be converted to B bits of digital resolution to support the dynamic range desired by the digital detector. Currently, one of the most cost and power efficient ways to perform this is to use a 1-bit sigma delta A/D converter 22 followed by a decimation filter 24 to provide the desired in-band dynamic range. The decimation filter must convert the highly oversampled 1-bit data stream from the sigma delta to B bits of resolution running at a much lower sampling rate. As it performs this, it must filter out the out-of-band quantization noise created by the sigma delta as well as preserve the in-band signal-to-noise ratio when an off-channel signal that can alias into the band of interest is present. In addition, following the decimation filter but preceding a digital detector circuit 28, a channel filter 26 is typically also needed to sufficiently attenuate adjacent channel interfering signals which may affect the signal-to-noise ratio in the band of interest. The present invention provides for a unique architecture in the form of a combined decimation and channel filter 23 that performs both functions efficiently to achieve minimal cost and current drain for an I and Q quadrature signal path. It has been shown that one of the most cost, power, and performance efficient ways to meet the specified criteria of attenuating out-of-band quantization noise created by a sigma delta converter is to use a cascaded comb filter for decimation filtering purposes. Hence, several types of cascaded comb filter structures will be shown that may be used in accordance with the present invention, including single stage and multistage versions, which may be used for decimation filtering applications. It should be noted that in most practical applications, the amount of aliasing protection provided by a single comb filter is typically insufficient during decimation. It is more desirable to cascade a number of comb filters to provide higher aliasing protection. Cascading M such comb filters to decimate by a ratio D results in the following transfer function:

$$H(z) = \frac{1 - z^{-D}}{1 - z^{-1}}$$

Figure 2:
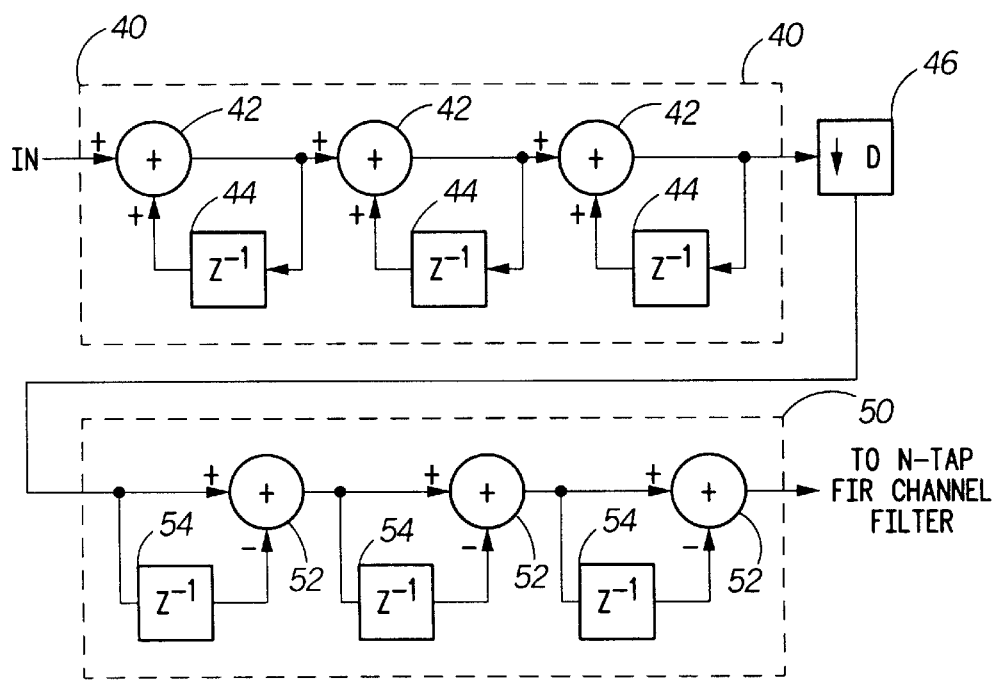
FIG. 2 illustrates a block diagram of a cascaded comb filter used in a single stage decimation along with a channel filter that may be used in accordance with the present invention.
Figure 3:
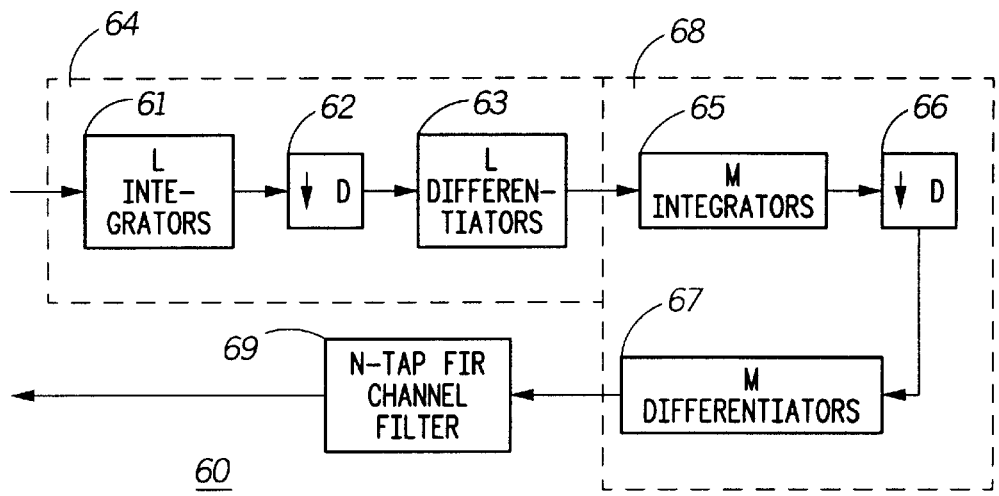
FIG. 3 illustrates another cascaded comb filter used in multistage decimation along with a channel filter in accordance with the present invention.

The filter 30 shown in FIG. 2 is an example of 3 cascading comb filters in a single stage decimation along with a channel filter. The filter 30 includes an integrator block 40 having 3 summing devices 42 coupled to 3 delay devices 44 as shown. The decimation ratio D as embodied in a down sampling element 46 couples to the differentiator block 50 which has 3 subtracting devices 52 coupled to 3 delay devices 54 as shown. When decimating by higher ratios, however, a single stage decimation structure as shown in FIG. 2 requires a very large number of cascaded comb filters. This is very undesirable, particularly from a current drain and performance perspective, because it requires an unreasonably large number of integrators to run at the highest clock frequency. In fact, in many cost-efficient and low voltage CMOS semiconductor processes, it is not even possible to achieve such high clock rates for a large number of integrators running at the highest sampling rate. Hence, a more reasonable approach to perform decimation by a higher ratio is to perform decimation over several stages using multistage comb filters such as that shown in FIG. 3. FIG. 3 only shows a 2-stage decimation with channel filter architecture 60, however, it may be extended to as many stages as desired. Also, note that in most cases, M will be greater than L to provide sufficient aliasing attenuation at the first stopband edge in the decimator output. Filter 60 receives a one bit input from the A/D converter (not shown) into a L cascaded comb filter section 64 having L integrators in block 61, L differentiators in block 63 with a down sampling element 62 coupled between blocks 61 and 63 as shown. The filter 60 further comprises a M cascaded comb filter section 68 (coupled to the L cascaded comb filter section 64) having M integrators in block 65, M differentiators in block 67 with a down sampling element 66 coupled between blocks 65 and 67 as shown. The output from the M cascaded comb filter section 68 preferably provides the input to a N-Tap FIR channel filter 69. The following equation describes the transfer function of the generalized 2-stage decimation architecture shown in FIG. 3:

$$H(z) = \left[\frac{1 - z^{-D_1}}{1 - z^{-1}}\right]^L \left[\frac{1 - z^{-D_2}}{1 - z^{-1}}\right]^M$$

FIG. 3 shows a channel filter which is typically needed after decimation in wireless receivers. The channel filter 69, among other things, sufficiently attenuates interfering adjacent channel signals. Channel filter 69 also compensates for unacceptable passband droop that is typically caused by the preceding stages of comb filters. To perform these types of functions in a systematic fashion while preserving the linear phase properties of the received signal, an FIR type of filter is typically desirable to implement the channel filter.

To further minimize the cost of the multistage comb filters in FIG. 3 for M>L, the L differentiators in the section or stage 64 can cancel L of the M integrators in the section or stage 68. This can be done because we are simply canceling the zeros in the differentiators with their counterpart poles in the integrators. The resulting architecture, after the cancellation of terms, is shown in the filter architecture 70 of FIG. 4. The filter architecture 70 preferably has a first section 71 with L integrators coupled to a second section 73 with M-L integrators. The second section 73 is preferably coupled to a third section 75 with M differentiators. Between the first section 71 and second section 73 is a down sampling element 72. Likewise, between the second section 73 and third section 75 is a down sampling element 74. The output from section 75 preferably provides the input to a N-Tap FIR channel filter 76.

Figure 4:
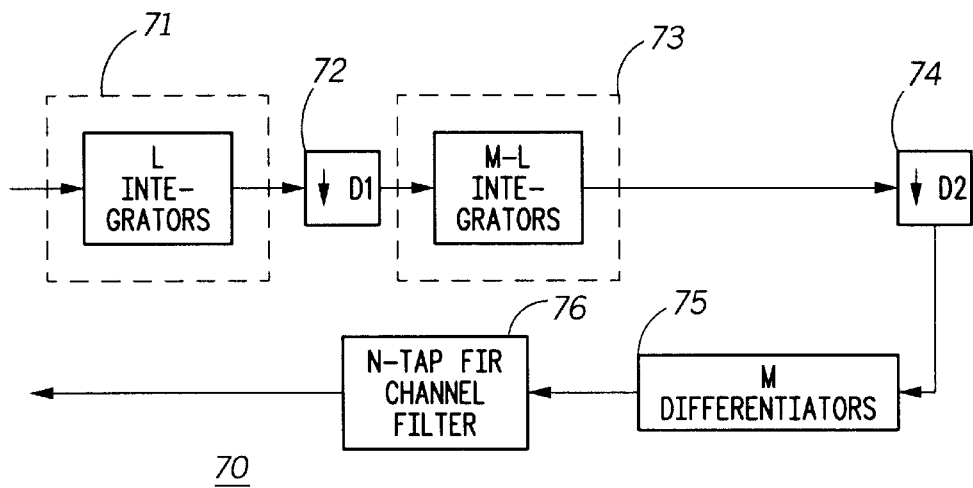
FIG. 4 illustrates another cascaded comb filter after term cancellation in accordance with the present invention.

In many cases, however, the architecture shown in FIG. 4 fails to provide sufficient attenuation in the first stopband edge without significantly increasing M. Recall that M is the number of comb filters cascaded in the last decimation stage. To achieve sufficient attenuation in the first stopband edge without increasing M, one trick is to replace the order D comb filter in the last decimation stage by an order (D+1) comb filter. Note that D is the decimation ratio in the last stage. The effect of this is to shift one of the zeros in the last decimation stage just slightly relative the other ones in the same stage to provide improved stopband attenuation at a negligible cost impact. The previous 2-stage decimation transfer function may be modified as follows to reflect such a modified architecture:

$$H(z) = \left[\frac{1 - z^{-D_1}}{1 - z^{-1}}\right]^L \left[\frac{1 - z^{-D_2}}{1 - z^{-1}}\right]^{M-1} \left[\frac{1 - z^{-(D_2+1)}}{1 - z^{-1}}\right]$$

Note that the cost overhead to achieve the improved stopband attenuation is very minor since it involves just an extra subtractor immediately following two downsampling ($D_2$) blocks (not shown). Thus, an cascading comb filter implementing this improvement would preferably comprise a first section with L integrators, a second section with M-L-1 integrators downsampled for a third stage and M-L integrators separately downsampled for the third stage, and wherein the third stage has M diferentiators and wherein M is greater than L (not shown).

As discussed earlier, an FIR type of filter is typically desirable to use in the channel filter. This is so that the passband droop created by the comb filters can be efficiently and systematically compensated using efficient FIR filter coefficient design methods as well as achieve the desired adjacent channel attenuation. Another reason for using an FIR type of filter is so that the linear phase properties of the received signal is preserved. This leads to better static and simulcast performance of the receiver.

Figure 5:
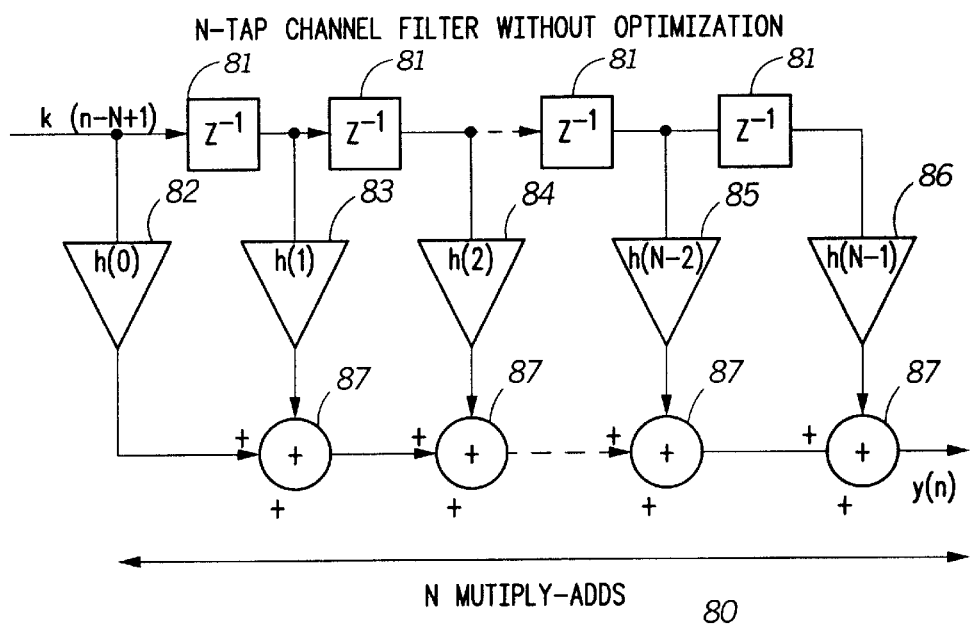
FIG. 5 illustrates a block diagram of a N-Tap channel filter with out optimization.
Figure 6:
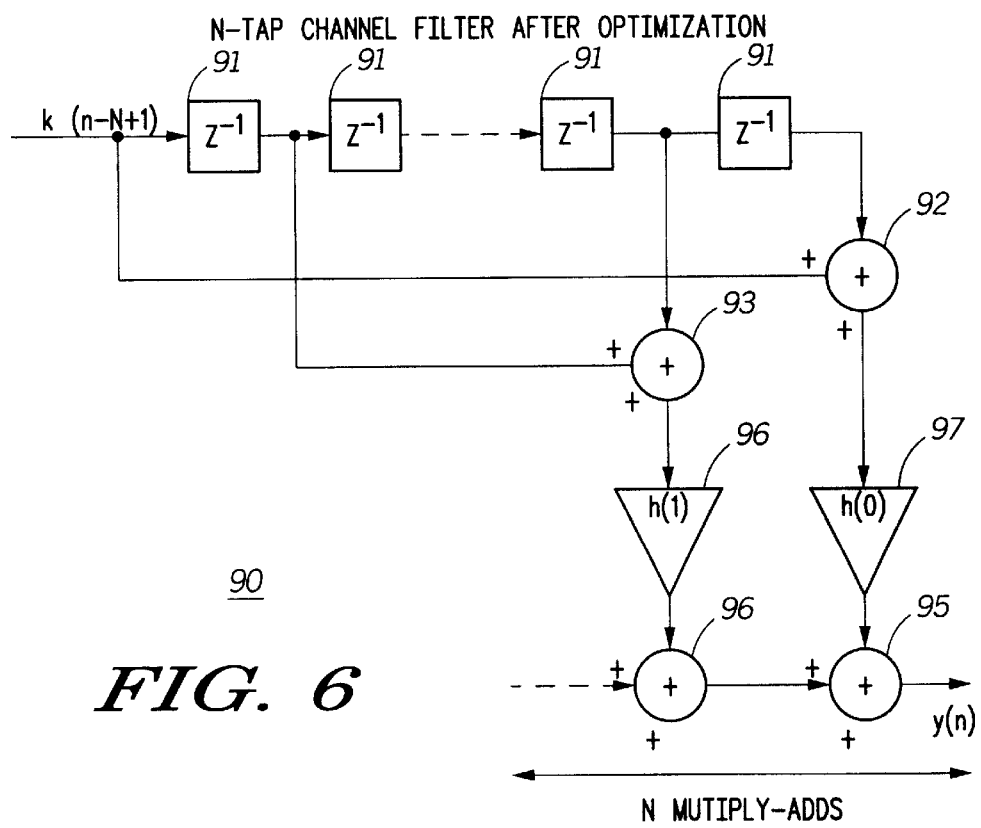
FIG. 6 illustrates a block diagram of a N-Tap channel filter after optimization.

The generalized hardware architecture shown in FIG. 5 is also used for the channel filtering functionality which occurs immediately after the decimation filtering process. The N-Tap channel filter 80 of FIG. 5 preferably includes a series of delays elements 81 coupled to filters 82–86 with predetermined coefficients. The output of the filters are summed using summing elements 87 as shown. The output of a basic N-tap FIR filter is characterized by this simple equation:

Equation 1:

$$y(n) = \sum_{i=0}^{N-1} h(i) \times (n - i)$$

where h(i) are the filter coefficients obtained from lookup table 127 (see FIG. 7), x(n−i) are the past and present input data samples, and y(n) is the current output data sample. A direct implementation of this equation is shown in FIG. 5. However, since linear phase FIR filters have symmetrical coefficients, we can simplify the implementation of the above equation, as discussed in previous literature, as follows:

Equation 2:

$$y(n) = \sum_{i=0}^{[\frac{N-1}{2}]} h(i)(x(n-i-N-1) + x(n-i))$$

for even N. Notice that this latter equation reduces the number of iterations by a factor of 2. This significantly reduces the current drain of any FIR filter implementation since it reduces the number of power hungry multiplications by a factor of 2 while merely requiring an extra low power addition operation in each iterate cycle. This equation also leads to lower cost since the storage needs for the coefficients h(i), is reduced by a factor of 2. A direct implementation of this modified equation is shown in FIG. 6. The N-Tap channel filter 90 of FIG. 6 preferably comprises a series of delay elements 91 coupled to summing elements 92 and 93. The summing elements provide corresponding outputs to filters 96 and 97 whose outputs are likewise summed using summing elements 94 and 95 as shown to obtain the current output data sample y(n).

The present invention illustrates a very low cost and power efficient hardware architecture that can use any one of the single or multistage architectures discussed previously to perform decimation and channel filtering. Note that our hardware architecture is not limited to a 2-stage decimation architecture, but any number of stages of decimation can be used.

Figure 7:
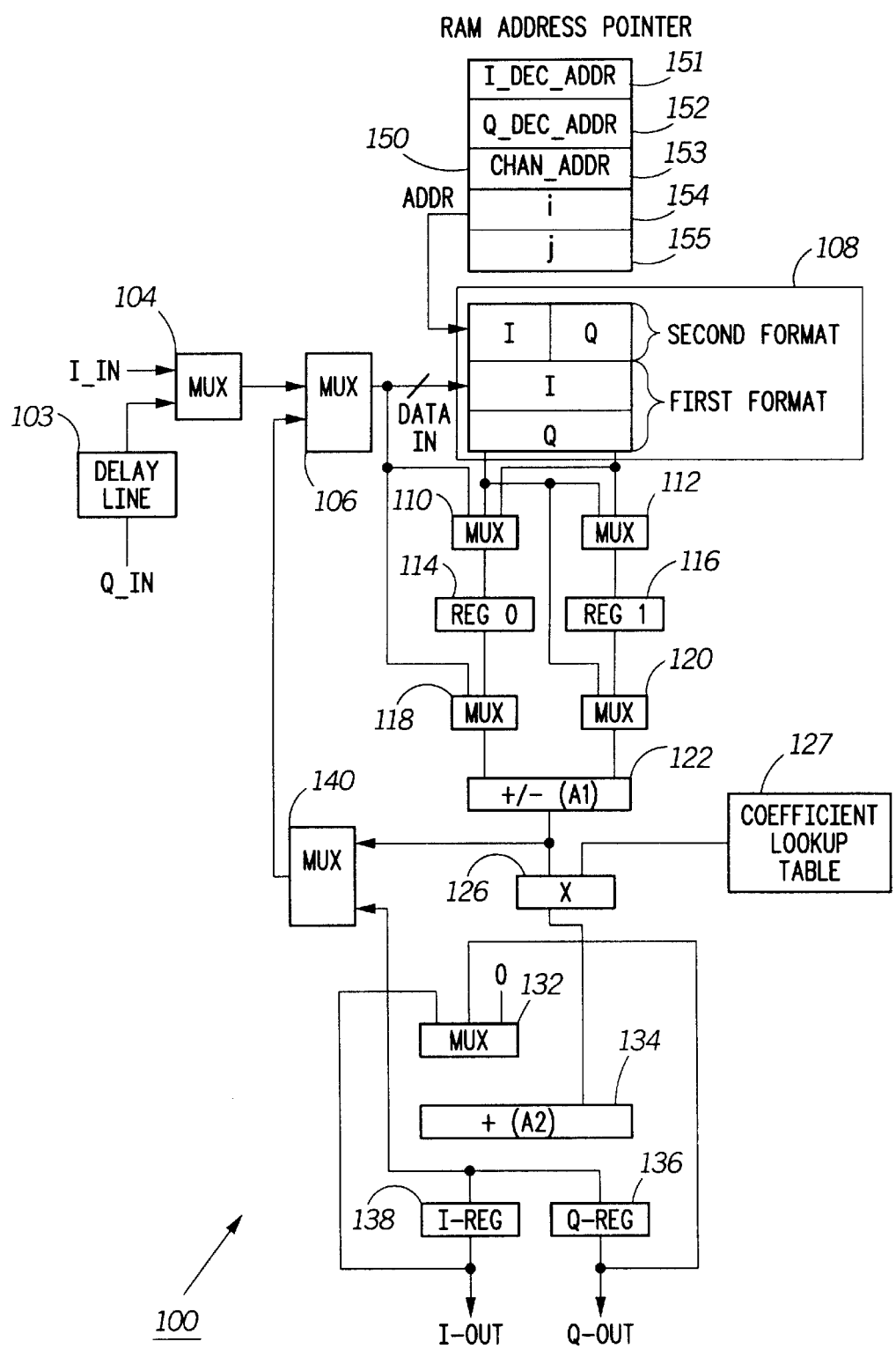
FIG. 7 illustrates a block diagram of a dedicated hardware architecture for performing both decimation an d channel filtering.

FIG. 7 shows an architecture 100 to perform single or multistage decimation filtering as well as channel filtering in a single dedicated hardware architecture. A single resource shared RAM 108 is employed to provide the storage needs for the decimation and channel filters. In most practical multistage decimation filters, the bit width at the output of the final stage decimation filter is typically much larger than the final bit width precision desired at the channel filter output. This is because the bit width growth at each successive decimation stage is "K×log$_2$D" bits larger than that in the previous stage to support the largest possible values in the later stages. After cancellation of poles and zeros in a multistage decimation filter to minimize cost, all stages of the resulting multistage decimation filter must support the largest bit width determined by the final stage. For these reasons, the memory allocation scheme shown in FIG. 7 is used to store the intermediate results of the I (In-phase) and Q (Quadrature-phase) decimation and channel filters. Notice that because the bit width of the multistage decimation filter is typically much larger than that of the channel filter, the intermediate result stored in a first format and the decimation final result stored in a second format of the I and Q decimation filter share the same RAM locations to minimize cost. The second format storage scheme is unlike the first format storage scheme employed by the I and Q decimation filters because of the much larger bit width of the first format. Also, as will be discussed later, the storage scheme used by the channel filters greatly aids in significantly reducing number of cycles needed to generate a new result.

As illustrated in the previous section, decimation filtering is primarily composed of consecutive integrators and differentiators running at different sampling rates. It can be seen from FIG. 4 that the total number of integrators and differentiators in either of these multistage decimators is 2M. Hence, for both the I and Q signal paths, the total number of the integrators and differentiators is 4M. Thus, the total number of delay elements for both the integrators and differentiators is 4M. This is taken into account in a cost-efficient manner in FIG. 7 by the sequential I and Q storage space allocated in the RAM for decimation filtering.

An integrator function is performed as follows in FIG. 7. The current input data sample is added (using the adder/subtractor element Al or element 122) to the RAM location which performs the storage operation for the delay element of that particular integrator. The result is then stored in the temporary register REG0 (element 114) adder/subtractor as well as back into the same RAM location. The former type of storage is performed so that the result is available as an input data sample for the next integration operation. The latter type of storage is performed because the RAM is performing the cost-efficient storage operation for each delay element in each integrator. Note that the input data sample for a given integration operation can also come from either of the external I_IN or Q_IN input if such a new data sample is available.

A differentiation operation in the specified figure occurs in a similar fashion. The memory location which performs the storage for a given differentiator's delay element is subtracted (using element Al or 122) from the input data sample. The result may then be stored in register REG0 (element 114) as well as back into the same RAM location. The reasons for this is similar to that previously described for the integration operations. The input data sample for a particular differentiation operation can come from either the specified register or from the external I_IN/Q_IN inputs. The former path is employed for a nested differentiation operation while the latter path is used when a new external data sample is available.

We will now discuss how channel filtering is performed in FIG. 7 using Equation 2 (current drain efficient implementation). For reasons delineated previously, the bit width of the channel filter is typically much smaller than the bit width needed for multistage decimation filters due to reasons discussed previously. Hence, N samples each of the I and Q data input data samples are stored in the RAM as shown in FIG. 7. Each I and Q pair of input data samples received from the decimation filter are stored in the same row of the RAM. This is so that we can alternate between I and Q filtering calculations to efficiently compute the results for both channels after only N+4 clock cycles as opposed to 2N+4 clock cycles. Note that the 4 extra cycles include 3 cycles needed for the initial delay (or latency) through the last 3 pipeline stages. Also, an additional clock cycle is needed to generate the final Q-channel result. The latter is due to the manner in which we alternate between I and Q channel filtering calculations. Note that pipeline registers that may be required in the datapaths described to satisfy the speed limitations of the semiconductor process are purposely omitted so as to remain technology independent. These include any pipeline registers that may be required between REG0, REG1, and I-REG, Q-REG.

By taking advantage of the symmetrical coefficients in a linear phase FIR filter (see Equation 2), the number of coefficients which need to be stored in a look up table 127 is reduced by a factor of 2 (see FIG. 7). This further reduces the overall cost. Note that in an actual hardware implementation, it may be more desirable to implement the coefficient lookup table in either a custom ROM or in random combinatorial logic depending upon the total number of bits in the lookup table. Cost, current drain, and performance tradeoffs would need to be performed based upon the specified number of total bits.

We will now go through two iterations of the FIR channel filtering algorithm for the I and Q channels to try and exemplify it.

New results are generated in our architecture at the I-REG and Q-REG register outputs after every N+4 clock cycles relative to the time that new I and Q input data samples are received from the decimation filter. As new I and Q data samples are received, they are stored in the same row of the RAM based upon the current position of the start_ptr address pointer. This pointer essentially behaves the same way as that for a circular buffer. In other words, the indicated pointer addresses the channel filter RAM locations in a circular modulo N and consecutive fashion when performing the filtering calculations after new pair of I and Q data samples have been received. When such new I and Q data samples are received, they are stored in the memory location containing the oldest data samples. This storage scheme is similar to that used in a circular FIFO (First-In-First-Out) register file. During the same cycle that new I[0] and Q[0] data samples are stored in RAM, the REG0 and REG1 temporary registers are also initialized using these new I and Q data samples as follows:

$$REG0 <= I[0]$$

$$REG1 <= Q[0]$$

where I[0] and Q[0] represent the most recent input sample data. The accumulator registers, I-REG and Q-REG, must also be reset during this initialization clock cycle before any new filtering calculations can begin. Following the specified initialization cycle, the first intermediate result for the I-channel is evaluated by performing:

$$I\text{-}REG <\!\!-\!\! I\text{-}REG+(REG0+I[(N-1) \text{ modulo } N])*C[0]$$

to effectively compute:

$$I\text{-}REG <= I\text{-}REG+(I[0]+I[(N-1) \text{ modulo } N])*C[0]$$

where C[i] is row i of the coefficient lookup table and I[j] is the first half of row j in the RAM. This equation essentially combines the most recent and the oldest input data samples stored in RAM to generate the first intermediate result for the I-channel. Note that the specified equation actually takes 3 clock cycles to evaluate in the specified architecture after the initialization cycle. However, each successive intermediate result stored in I-REG is actually available during successive cycles due to the highly pipelined hardware architecture.

At the same time that I[(N−1) modulo N] is accessed, based upon the equation above, from the upper half of the specified row in the RAM, the lower half of the row is also read in the same cycle to store Q[(N−1) modulo N] into the temporary register, REG0, as follows:

$$REG0 <= Q[(N-1) \text{ modulo } N])$$

Immediately following this RAM read operation, the first intermediate result for the Q-channel is evaluated next as follows:

$$Q\text{-}REG <= Q\text{-}REG+(REG0+REG1)*C[0]$$

to effectively compute:

$$Q\text{-}REG <= Q\text{-}REG+(Q[0]+Q[(N-1) \text{ modulo } N])*C[0]$$

since REG0 and REG1 have already been loaded with Q[0] and Q[(N−1) modulo N]. Note that in the above sequence of calculations for the I and Q channels, there is never an arithmetic resource conflict because of the way we alternate between I and Q channel filtering operations by taking full advantage of the temporary registers, REG0 and REG1.

During the first cycle of evaluating the above equation for Q-REG, the temporary registers, REG0 and REG1, are loaded with the next I and Q channel data for the next index increment:

$$REG0 <= I[1]$$

$$REG1 <= Q[1]$$

to allow for the computation of:

$$I\text{-}REG <\!\!-\!\! I\text{-}REG+(REG0+I[(N-2) \text{ modulo } N])*C[1]$$

to effectively evaluate:

$$I\text{-}REG <= I\text{-}REG+(I[1]+I[(N-2) \text{ modulo } N])*C[1]$$

while REG0 is loaded with Q[(N−2) modulo N] at the same time that I[(N−2) modulo N] is accessed from RAM. Following this RAM read operation, the next intermediate Q-channel result is evaluated by computing:

$$Q\text{-}REG <= Q\text{-}REG+(REG0+REG1)*C[1]$$

to effectively compute:

$$Q\text{-}REG <= Q\text{-}REG+(Q[1]+Q[(N-2) \text{ modulo } N])*C[1]$$

since REG0 and REG1 have already been loaded with Q[1] and Q[(N−2) modulo N] during previous cycles.

Figure 8:
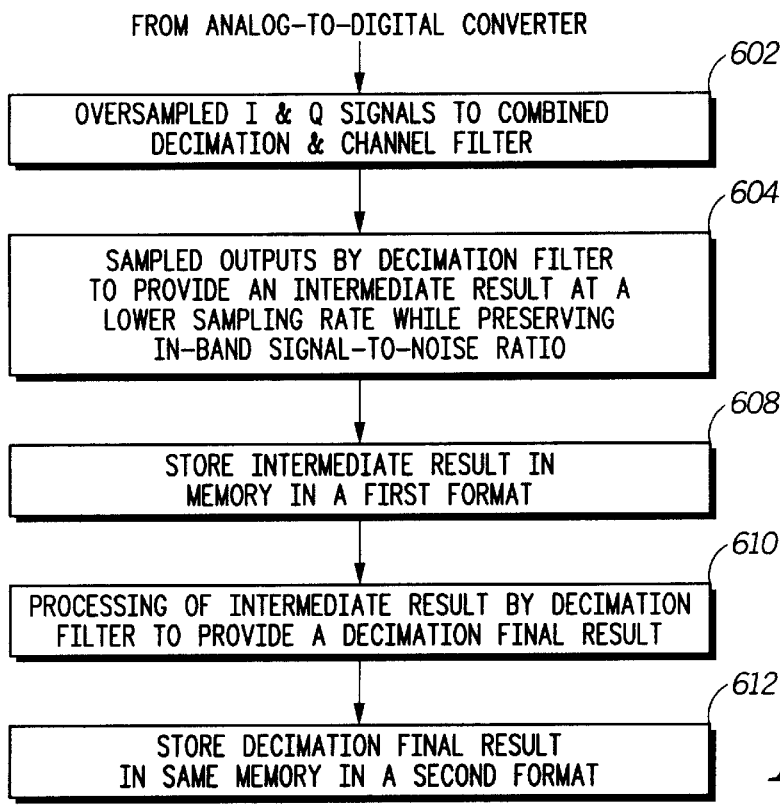
FIG. 8 discloses a flow chart of a decimation and channel filtering method in an oversampling system in accordance with the present invention.

The above sequence of operations is allowed to continue, as prescribed by the algorithm in FIG. 8, until the I-REG and Q-REG accumulator registers contain the filtered outputs after a total of N+4 clock cycles. Notice how the algorithm alternates between the I-channel and the Q-channel filtering operations to efficiently compute the filtered outputs in only N+4 cycles instead of 2N+4 cycles for both channels.

Figure 10:
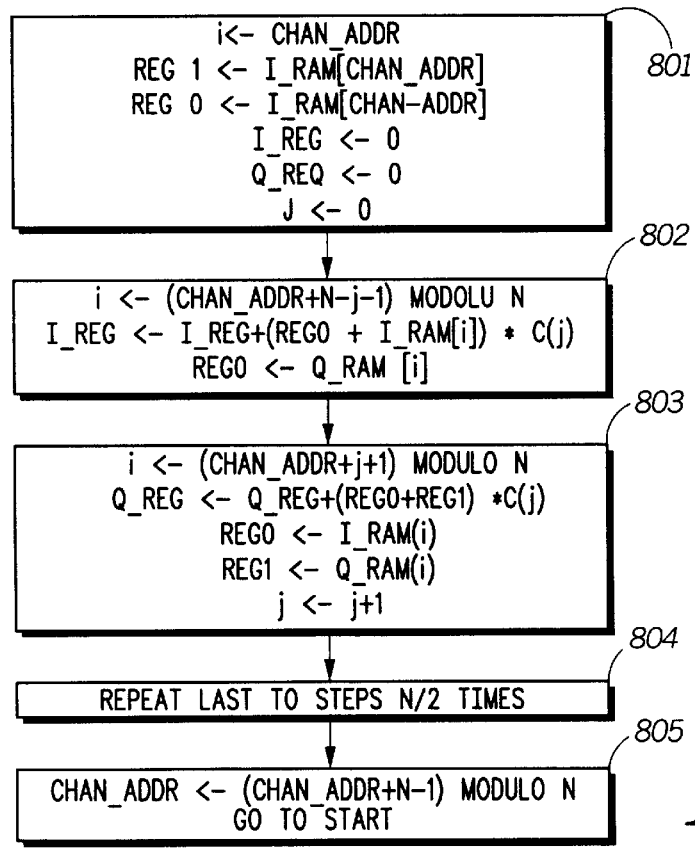
FIG. 10 discloses a flow chart of a channel filtering algorithm in an oversampling system in accordance with the present invention.
Figure 9:
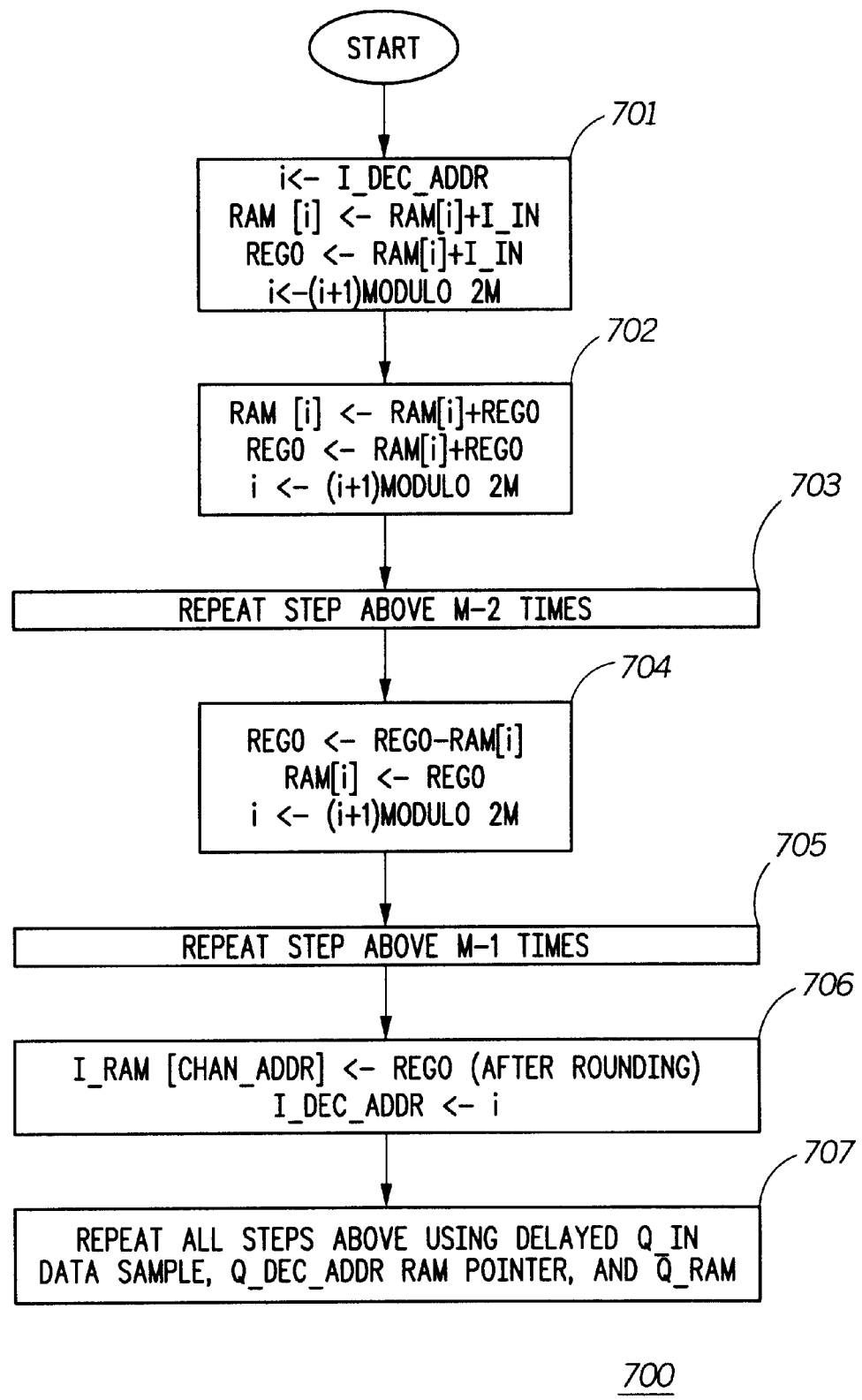
FIG. 9 discloses a flow chart of a decimation filtering algorithm in an oversampling system in accordance with the present invention.

FIGS. 8–10 attempt to algorithmically describe how the hardware architecture in FIG. 7 is efficiently used to perform decimation and channel filtering for both the I and Q channels. Also note the following nomenclature with respect to the description of FIGS. 5–8:

RAM[i]: denotes the contents of RAM location i

I_RAM[i]: denotes the contents of RAM location I in the most significant half of the RAM (in the second format)

Q_RAM[i]: denotes the contents of RAM location i in the least significant half of the RAM (in the second format)

A<—B: denotes that the element A is loaded with the contents of element B. Multiple assignments of this type performed in the same box indicate that these assignments are executed during the same clock cycle.

REG0, REG1, I-REG, and Q-REG are elements 114, 116, 138, and 136 as shown in FIG. 7, respectively.

FIG. 8 provides an overview of a decimation and channel filtering method 600 in an oversampling system. Once a signal is received from an analog-to-digital converter, an oversampled I and Q complex signal is provided at step 602 to a combined decimation and channel filter. This preferably comprises the step of providing a pair of 1-bit or more highly oversampled sampled data from a pair of I and Q signals from an analog-to-digital converter. At step 604, sampled outputs are provided by a decimation filter of the combined decimation and channel filter to a memory to provide intermediate results. This step preferably preserves a desired in-band signal-to-noise ratio at a lower sampling rate. At step 608, the intermediate results from the decimation filter is stored in the memory in a first format. Next, at step 610, the intermediate result gets processed by the decimation filter to provide a decimation final result. Then, the decimation final results are stored in the memory in a second format at step 612. Preferably, the storing of the intermediate results and the storing of the decimation final results comprise the step of storing the intermediate result in a random access memory in the first format and reusing the same random access memory to store the decimation final result in a second format.

Referring to FIGS. 7 and 9, a flow chart of the decimation filtering algorithm 700 is shown in accordance with the present invention. At step 701, the RAM address pointer i (154) from a list of pointer registers (150) is initialized. Also at step 701, the current input data sample is added with the current RAM (108) contents (at location i) and the result is stored in the same RAM location. This result is also stored in REG0 (114) during the same cycle. The pointer i (154) is then updated to point to the next location in a circular buffer approach. At step 702, the contents of the next RAM location is added with REG0 (114) and the result is stored in the same RAM location as well as REG0 (114). The RAM pointer I is updated in a similar fashion as in step 701. In step 703, step 702 is repeated M−2 times to compute the result of M integrations required by the decimation filtering algorithm. At step 704, the current contents of the RAM at the specified location is subtracted from REG0 (114) with the result being stored in REG0. In the same clock cycle, the same RAM location is loaded with the prior contents of REG0. The I pointer (154) is then updated. At step 705, step 704 is repeated M−1 times. At step 706, the RAM location pointed to by CHAN_ADDR pointer (153) is loaded with the rounded value of REG0 (rounding is done to accommodate the second format without losing any significant performance in practical applications). The current value of I is saved in the I_DEC_ADDR pointer (151). At step 707, steps 701 through steps 706 are repeated using a Q_IN data sample, Q_DEC_ADDR RAM pointer (152) and Q_RAM (instead of I_RAM.)

Referring to FIGS. 7 and 10, a flow chart of the channel filtering algorithm 800 is shown in accordance with the present invention. At step 801, the inner-most I and Q RAM locations are loaded in REG0 and REG1. At step 802, a pointer is updated to point to the outer-most elements of I and Q. REG0 is combined with the outer-most element of I to compute I_REG (138). In the same clock cycle, REG0 is loaded with the outer-most value of Q. At step 803, REG0 (containing the outermost value of Q) is combined with REG1 (which contains the inner-most value of Q from step 701) to compute Q-REG (136). At step 804, steps 802 and 803 are repeated N/2 times. At step 805, the CHAN_ADDR pointer is updated and the decimation filtering algorithm (700) of FIG. 9 starts again. In the present invention, the I and Q datapaths are alternated to reduce the number of cycles to perform I and Q channel filtering by a factor of 2 (N clock cycles as opposed to 2N+4 clock cycles). The present invention provides advantages in reduced current drain and higher possible clock rates by using the techniques described above.

A very low cost and power efficient hardware architecture to perform both decimation filtering as well as channel filtering employing the same basic architecture, in the baseband section of a wireless receiver is shown. The decimation filter may be either a single stage cascaded comb filter, a multistage cascaded comb filter, or a multistage structure but with a shifted zero in the last decimation stage. Any one of these cost and power efficient decimation structures is supported by the hardware architecture presented herein. The same hardware architecture is also used for the N-tap linear phase FIR channel filter.

Low cost and minimal current drain is achieved in this architecture due to the use of a single 1-port RAM (as opposed to a dual port RAM) to perform the storage needs for all the delay elements in the decimation and channel filters. Further cost and current drain is minimized due to the fact that the same arithmetic units perform both decimation and channel filtering operations. Also, current drain is minimized because of the way that this algorithm generates both the I and Q channel filtered outputs in only N+4 clock cycles for N-tap channel filters as opposed to 2N+4 clock cycles. The latter is achieved due to the manner in which the hardware algorithm alternates between I and Q channel filtering calculations to generate the desired outputs.

The present invention illustrates a combined decimation filter and channel filter performing a decimation function and a channel filtering function by using a single memory element with a dedicated hardware architecture wherein the architecture includes two temporary registers, an adder/subtractor, a multiplier, and an accumulator and wherein the decimation function utilizes the single memory element in a first format along with a first of the two temporary registers and the adder/substractor and wherein the channel filtering function utilizes the single memory element in a second format along with a second of the two temporary registers and the adder/subtractor, the multiplier, and the accumulator. Preferably, a channel filter algorithm uses a single memory element to reduce the number of clock cycles by a factor of two when taking advantage of the second format.

The above description is intended by way of example only and is not intended to limit the present invention in any way except as set forth in the following claims.

What is claimed is:

1. A decimation and channel filtering method in an oversampling system, comprising the steps of:
   providing an oversampled I and Q complex signal to a combined decimation and channel filter;
   converting and filtering the oversampled I and Q complex signal by a decimation filter within the combined decimation and channel filter to one or more sampled outputs;
   providing the one or more sampled outputs by the decimation filter to a memory to provide an intermediate result;
   storing the intermediate result in the memory in a first format;
   further processing the intermediate result by the decimation filter to provide a decimation final result; and
   storing the decimation final result in a second format in the memory.

2. The decimation and channel filtering method of claim 1, wherein the step of providing the oversampled complex signal comprises the step of providing a pair of one or more bit highly oversampled sampled data from a pair of I and Q signals from an analog to digital converter.

3. The decimation and channel filtering method of claim 1, wherein the step of converting and filtering the oversampled I and Q complex signal by the decimation filter comprises the step of preserving a desired in-band signal-to-noise ratio at a lower sampling rate for the I and Q signal paths.

4. The decimation and channel filtering method of claim 1, wherein the steps of storing the intermediate result and of storing the decimation final result comprises the step of storing the intermediate result in a random access memory in the first format and reusing the same random access memory to store the decimation final result in the second format.

5. A combined decimation and channel filter, comprising:
a cascaded comb filter for receiving in-phase signals and quadrature signals and serving as a decimation filter, wherein the cascaded comb filter includes a plurality of delay devices;
an N-tap linear phase FIR channel filter coupled to the cascaded comb filter, wherein the N-tap linear phase FIR channel filter includes a plurality of delay elements; and
a single RAM coupled to both the cascaded comb filter and the N-tap linear phase FIR channel filter, wherein the plurality of delay devices and the plurality of delay elements are stored within the single RAM.

6. The combined decimation and channel filter of claim 5, wherein the cascaded comb filter is a single stage cascaded comb filter.

7. The combined decimation and channel filter of claim 5, wherein the cascaded comb filter is a multistage cascaded comb filter.

8. The combined decimation and channel filter of claim 5, wherein the cascaded comb filter has a first section of L cascaded comb filters with L integrators and L differentiators and a second section of M cascaded comb filters with M integrators and M differentiators, wherein M is greater than L.

9. The combined decimation and channel filter of claim 5, wherein the cascaded comb filter has a first section with L integrators, a second section with M-L integrators, and a third stage with M differentiators, wherein M is greater than L.

10. The combined decimation and channel filter of claim 5, wherein the cascaded comb filter has a first section with L integrators, a second section with M-L-1 integrators downsampled for a third stage and M-L integrators separately downsampled for the third stage, and wherein the third stage has M differentiators and wherein M is greater than L.

11. A combined decimation and channel filter for receiving an oversampled complex signal in an oversampled system, comprising:
a decimation filter which provides sampled outputs to a memory to provide an intermediate result, wherein the intermediate result is stored in the memory in a first format,. wherein the decimation filter further processes the intermediate result to provide a decimation final result, and further wherein the decimation final result is stored in the memory in a second format; and
a channel filter which processes the decimation final result to provide a final result.

12. The decimation and channel filter of claim 11, wherein the memory is a random access memory that stores the intermediate result in the first format and reuses the same random access memory to store the decimation final result in the second format.

13. A dedicated hardware architecture for implementing a combined decimation and channel filter performing a decimation function and a channel filtering function, comprising:
a single memory element;
two temporary registers coupled to the single memory element for temporary storage of one or more results received from the single memory element;
an adder/subtractor coupled to an external input of the combined decimation and channel filter, the two temporary registers, and the single memory element for performing mathematical operations using the external input and one or more results stored in the two temporary registers;
a multiplier coupled to the adder/subtractor and a coefficient lookup table for performing multiplication operations using the outputs of the adder/subtractor and the coefficient lookup table; and
an accumulator having an accumulator output and an accumulator input, wherein the accumulator input is coupled to the multiplier and the accumulator output for performing accumulations of one or more of the results of the multiplication operations,
wherein the decimation function is performed using the single memory element in a first format along with a first of the two temporary registers and the adder/subtractor and wherein the channel filtering function is performed using the single memory element in a second format along with a second of the two temporary registers and the adder/subtractor, the multiplier, and the accumulator.

14. The combined decimation filter and channel filter of claim 13, wherein a channel filter algorithm uses the single memory element and the two temporary registers to reduce the number of clock cycles by a factor of 2.

* * * * *